United States Patent
Bundhoo et al.

(10) Patent No.: US 7,928,748 B2
(45) Date of Patent: Apr. 19, 2011

(54) METHOD OF LOCATING FAILURE SITE ON SEMICONDUCTOR DEVICE UNDER TEST

(75) Inventors: Fayik Bundhoo, Camarillo, CA (US); William Ng, San Jose, CA (US)

(73) Assignee: National Semiconductgor, Santa Clara, CA (US)

( * ) Notice: Subject to any disclaimer, the term of this patent is extended or adjusted under 35 U.S.C. 154(b) by 0 days.

(21) Appl. No.: 12/229,454

(22) Filed: Aug. 22, 2008

(65) Prior Publication Data

US 2010/0045331 A1    Feb. 25, 2010

(51) Int. Cl.
*G01R 31/302* (2006.01)
(52) U.S. Cl. ............................ 324/752; 324/750
(58) Field of Classification Search .................. None
See application file for complete search history.

(56) References Cited

U.S. PATENT DOCUMENTS

| | | | |
|---|---|---|---|
| 6,952,106 B1 * | 10/2005 | Ng et al. | 324/751 |
| 6,967,491 B2 * | 11/2005 | Perdu et al. | 324/752 |
| 7,511,510 B2 * | 3/2009 | Kaszuba et al. | 324/555 |

* cited by examiner

*Primary Examiner* — Paresh Patel
(74) *Attorney, Agent, or Firm* — Jurgen K. Vollrath; Vollrath & Associates

(57) ABSTRACT

In an analysis of a semiconductor device under test (DUT) using a Thermal Induced Voltage Alteration (TIVA) tool, the TIVA is connected to an output of the DUT and the DC component on the output is decoupled from the TIVA. The remaining AC component from the output is analyzed by the TIVA while scanning the DUT with a scanning laser to identify locations on the DUT that produce signal anomalies at the DUT output.

16 Claims, 1 Drawing Sheet

METHOD OF LOCATING FAILURE SITE ON SEMICONDUCTOR DEVICE UNDER TEST

FIELD OF THE INVENTION

The invention relates to failure analysis of a semiconductor device under test (DUT). In particular it relates to a method of identifying failure sites on a DUT using a Thermal Induced Voltage Alteration tool (TIVA).

BACKGROUND OF THE INVENTION

One method of analyzing a failing semiconductor device, or a Device under Test (DUT) involves the use of Thermal Induced Voltage Alteration tool (TIVA) or Optical Beam Induced Resistance Change (OBIRCH) that make use of a scanning laser source to thermally induce voltage or current changes in the DUT. The TIVA uses a laser (Infra Red spectrum) to scan and thermally induce resistances changes and then monitor a voltage changes. The OBIRCH works similarly to the TIVA, but uses a laser to thermally activate the fail site and then monitor the current fluctuation. Thus they work on the principle that they sense variations at the power supply to the DUT. In other words they sense leakage currents at a DC level while a laser probe is used to scan across the DUT as illustrated in FIG. 1. By scanning back and forth with the laser over the DUT surface along a path, as indicated by reference numeral 100, the TIVA produces localized heating of the circuitry. This impacts the DC power supply reading as measured by the TIVA, allowing the TIVA to identify failure sites that produce leakage current. Typically the TIVA provides a visual picture of the DUT and identifies, by means of spots on the picture, the leakage current error sites. This is done by monitoring and collecting the x-y coordinate information of the laser probe at the time the DC power supply variation is identified. In addition the TIVA produces a die spot on the stored image of the DUT.

However, the TIVA is not capable of identifying and mapping failure sites that have a small AC signal fluctuation that is superimposed on a large DC level, thus severely limiting the use of the TIVA to the identification small AC signal and mapping of only a limited set of error conditions.

The present invention provides new applications for the TIVA and provides the means of effectively using the TIVA to identify and map other error conditions on a DUT.

SUMMARY OF THE INVENTION

According to the invention, there is provided a method of mapping errors on a DUT having at least one output, comprising connecting a TIVA to an output of the DUT, scanning the DUT with a scanning laser from the TIVA, monitoring signals on the at least one output for a voltage or current anomaly using the TIVA, and identifying the location on the DUT corresponding to the voltage or current anomaly (failure site). Typically the location of the failure site is stored in memory on the TIVA. Preferably the failure site is mapped onto an image of the DUT. The monitoring of the signals on the at least one output may include providing a constant voltage or current source (CPS) driven by the TIVA to define a DC voltage or current that can be monitored by the TIVA for variations and superimposing an AC component of the signal from the output onto the DC voltage or current. The AC component may be achieved by providing an AC coupling circuit between the DUT and the CPS, wherein the AC coupling circuit may include a capacitor. The CPS may include a resistor, and the TIVA may include a sensing amplifier to identify anomalies in the superimposed signal.

Further according to the invention, there is provided a method of mapping errors on a DUT having at least one output, comprising connecting a CPS that provides a constant voltage or current, to one of the at least one output, isolating an AC component emanating from said output, superimposing the AC component on the constant voltage or current from the CPS to define a detected signal, monitoring said detected signal for anomalies while scanning the DUT with a scanning laser, and identifying the locations on the DUT corresponding to the anomalies. The isolating of the AC component may include providing a capacitor between the output of the DUT and the CPS. The CPS may be defined by a TIVA and a resistor. The monitoring may be performed by a sensing amplifier on the TIVA, and the TIVA may further include the scanning laser, and a memory for storing information about the locations (e.g., the x-y components) on the DUT corresponding to the anomalies. The method may further comprise mapping those locations onto an image of the DUT and may include marking the DUT at those locations with die markers.

DETAILED DESCRIPTION OF THE INVENTION

The present invention provides a new application and method of use for a Thermal Induced Voltage Alteration tool (TIVA) by providing a way of monitoring the one or more outputs of a DUT on which fault conditions are being detected. Instead of using the TIVA in its intended fashion of monitoring direct current (DC) levels as measured at the power supply to the DUT, the present invention connects the TIVA to an output of the failing DUT.

Figure 1:
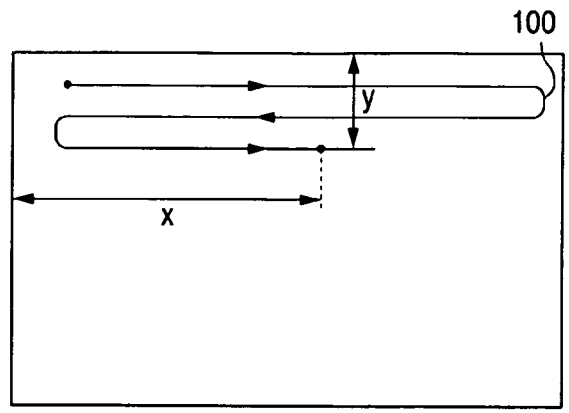
FIG. 1 is a representation of a typical scanning path of a TIVA scanning probe as known in the art.
Figure 2:
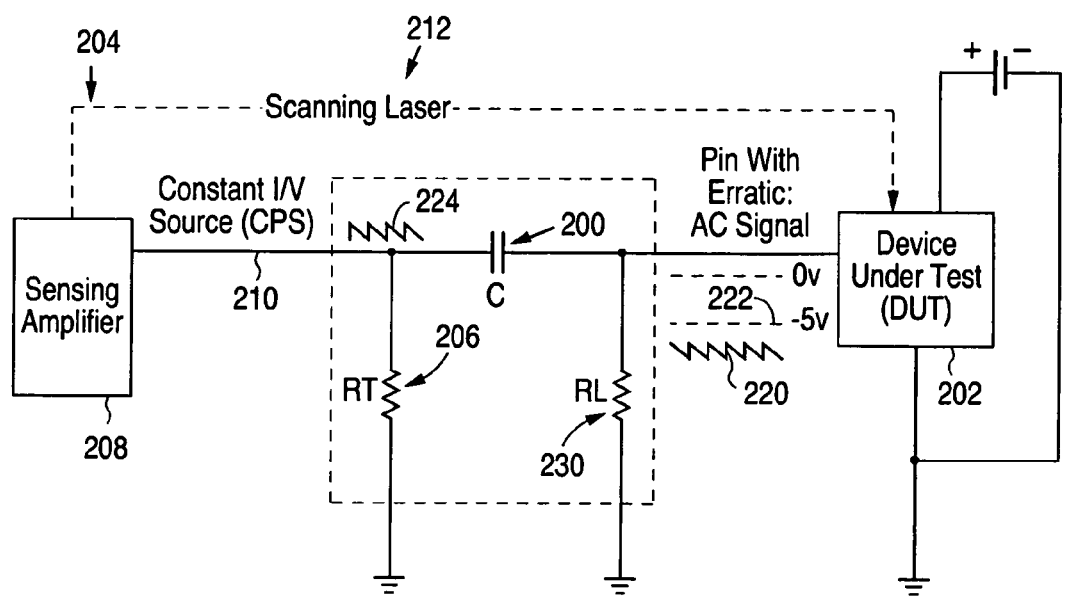
FIG. 2 is a simplified circuit diagram of one embodiment of the implementation of the invention.

It was however found that since both the DUT and the TIVA are powered, thereby driving a DC component onto the line connecting the DUT and the TIVA, it was necessary to eliminate this conflict. As part of the invention, an AC coupling circuit, which in the embodiment shown in FIG. 2 takes the form of a capacitor 200, is connected between the DUT 202 and the TIVA 204. In the embodiment shown, a 0.1 uF capacitor was found to work well. The TIVA defines a constant current or voltage source (CPS), which in this embodiment comprises a resistor 206, and further includes a sensing amplifier 208 to sense current or voltage changes on the line 210. In addition, the TIVA includes a scanning laser 212 that is used to stimulate the device under test in a manner known in the art. Since, according to the invention the TIVA is connected to an output pin of the DUT 202 the output signal typically comprises a sawtooth signal 220 superimposed on a negative DC signal 222. The effect of the capacitor 200 is to isolate the DC component emanating from the DUT 202 thereby ensuring that only the sawtooth signal passes through to the sensing amplifier 208 as indicated by the sawtooth signal 224. The constant current/voltage source as defined by the TIVA and the resistor 206 now defines a constant that is modulated by the incoming sawtooth signal 224. As the scanning laser 212 passes of an anomaly or failure site on the DUT it produces a variation in the sawtooth signal that causes a signal variation at the sensing amplifier 208. Thus by tracking the x-y coordinates of the scanning laser and noting the locations where the voltage or current anomaly is detected by the sensing amplifier 208, the TIVA can store this information in memory and visually represent the anomaly on a picture of the DUT, and in addition place a die spot on the DUT at the location of the anomaly. The circuit further includes a resistor 230 which emulates the loading of the DUT 202.

The present invention thus provides a new use for a TIVA by connecting it to an output of the DUT and decoupling the DC component from the DUT by interspersing a capacitor thereby avoiding competing driving between the DUT and the CPS. Since the CPS is in synchronicity with the scanning laser of the TIVA, a special record can be created of all erratic small signal (sawtooth) variations at the DUT output. These images are overlaid on the image of the DUT to provide a visual representation or map of the error or failure sites.

What is claimed is:

1. A method of mapping errors on a DUT having at least one output, comprising
    connecting a TIVA to an output of the DUT through an AC coupling circuit to filter out any DC component emanating from the DUT,
    scanning the DUT with a scanning laser,
    monitoring signals on the at least one output for a voltage or current anomaly using the TIVA, and
    identifying the location on the DUT corresponding to the voltage or current anomaly (failure site).
2. A method of claim 1, where the location of the failure site is stored in memory.
3. A method of claim 2, wherein the failure site is mapped onto an image of the DUT.
4. A method of claim 1, wherein monitoring the signals on the at least one output includes providing a constant voltage or current source (CPS) driven by the TIVA to define a DC voltage or current that can be monitored by the TIVA for variations.
5. A method of claim 4, wherein the CPS includes a resistor.
6. A method of claim 1, wherein the AC coupling circuit includes a capacitor connected in series between the TIVA and the output of the DUT.
7. A method of claim 6, wherein the TIVA includes a sensing amplifier to identify anomalies in the superimposed signal.
8. A method of mapping errors on a DUT having at least one output, comprising
    connecting a CPS that provides a constant voltage or current, to the at least one output,
    isolating an AC component emanating from said output,
    superimposing the AC component on the constant voltage or current from the CPS to define a detected signal,
    monitoring said detected signal for anomalies while scanning the DUT with a scanning laser, and
    identifying the locations on the DUT corresponding to the anomalies.
9. A method of claim 8, wherein isolating the AC component includes providing a capacitor between the output of the DUT and the CPS.
10. A method of claim 8, wherein the CPS is defined by a TIVA and a resistor.
11. A method of claim 10, wherein the monitoring is performed by a sensing amplifier on the TIVA.
12. A method of claim 11, wherein the TIVA includes the scanning laser.
13. A method of claim 12, wherein the TIVA includes a memory for storing information about the locations on the DUT corresponding to the anomalies.
14. A method of claim 13, wherein the information about the locations comprises the x-y components of said locations.
15. A method of claim 13, further comprising mapping said locations onto an image of the DUT.
16. A method of claim 15, further comprising marking the DUT at said locations with die markers.

* * * * *